United States Patent
LeFevre et al.

(10) Patent No.: US 9,054,050 B2
(45) Date of Patent: Jun. 9, 2015

(54) METHOD FOR DEEP SILICON ETCHING USING GAS PULSING

(71) Applicant: Tokyo Electron Limited, Minato-ku, Tokyo (JP)

(72) Inventors: Scott W. LeFevre, Balston Spa, NY (US); Alok Ranjan, Slingerlands, NY (US)

(73) Assignee: Tokyo Electron Limited, Tokyo (JP)

( * ) Notice: Subject to any disclaimer, the term of this patent is extended or adjusted under 35 U.S.C. 154(b) by 6 days.

(21) Appl. No.: 14/072,964

(22) Filed: Nov. 6, 2013

(65) Prior Publication Data

US 2015/0126033 A1     May 7, 2015

(51) Int. Cl.
*H01L 21/311* (2006.01)
*H01L 21/3065* (2006.01)

(52) U.S. Cl.
CPC ...... *H01L 21/31116* (2013.01); *H01L 21/3065* (2013.01)

(58) Field of Classification Search
None
See application file for complete search history.

(56) References Cited

U.S. PATENT DOCUMENTS

| | | |
|---|---|---|
| 6,303,512 B1 | 10/2001 | Laermer et al. |
| 6,784,108 B1 | 8/2004 | Donohoe et al. |
| 6,916,746 B1 | 7/2005 | Hudson et al. |
| 2004/0097090 A1 | 5/2004 | Mimura et al. |
| 2008/0061029 A1 | 3/2008 | Lai et al. |
| 2008/0293250 A1 | 11/2008 | Dussart et al. |
| 2009/0184089 A1 | 7/2009 | Chebi et al. |
| 2009/0275202 A1 | 11/2009 | Tanaka et al. |
| 2012/0301981 A1 | 11/2012 | Ozgur et al. |

OTHER PUBLICATIONS

International Search Authority, Search Report and Written Opinion issued in counterpart International Application No. PCT/US214/62922, dated Jan. 21, 2015, 8 pp.

*Primary Examiner* — Allan Olsen

(74) *Attorney, Agent, or Firm* — Wood, Herron & Evans, LLP (57) ABSTRACT

Techniques disclosed herein include methods for etching deep silicon features using a continuous gas pulsing process that etches high aspect ratio features having a relatively smooth profile. Such methods provide an etch rate faster than time-multiplexed etch-deposition processes. Techniques include using a continuous process that comprises a cyclic gas-pulsing process of alternating chemistries. One process gas mixture includes a halogen-containing silicon gas and oxygen that creates an oxide layer. A second process gas mixture includes a halogen-containing gas and a fluorocarbon gas that etches oxide and silicon.

14 Claims, 5 Drawing Sheets

METHOD FOR DEEP SILICON ETCHING USING GAS PULSING

BACKGROUND OF THE INVENTION

The invention relates to methods for etching features in a semiconductor substrate, including etching features in silicon.

The fabrication of integrated circuits (IC) in the semiconductor industry typically involves using a plasma reactor to create plasma that assists surface chemistry used to remove material from—and deposit material to—a substrate. Dry plasma etching processes are routinely used to remove or etch material along fine lines or within vias or at contacts patterned on a semiconductor substrate. A successful plasma etching process requires an etching chemistry that includes chemical reactants suitable for selectively etching one material while substantially not etching another material.

For example, on a semiconductor substrate, a pattern formed in a protective layer can be transferred to an underlying layer of a selected material using a plasma etching process. The protective layer can comprise a light-sensitive layer, such as a photoresist layer, having a pattern formed using a lithographic process. Once the pattern is formed, the semiconductor substrate is disposed within a plasma processing chamber, and an etching chemistry is formed that selectively etches the underlying layer while minimally etching the protective layer. This etch chemistry is produced by introducing an ionizable, dissociative gas mixture having parent molecules comprising molecular constituents that react with the underlying layer while minimally reacting with the protective or patterning layer. Production of the etch chemistry comprises introduction of a gas mixture and formation of plasma when a portion of the gas species present are ionized following a collision with an energetic electron. Heated electrons can serve to dissociate some species of the gas mixture and create a reactive mixture of chemical constituents (of the parent molecules).

With ionized gas species and a reactive mixture of chemical constituents provided, various features (e.g., trenches, vias, contacts, etc.) can be etched in exposed regions of the semiconductor substrate. Typical materials that are etched include silicon oxide ($SiO_x$), silicon nitride ($SiN_y$), poly-crystalline silicon (polysilicon), mono-crystalline silicon (silicon), and doped and un-doped silicon, for example.

SUMMARY

Time-multiplexed etching processes, such as the Bosch process (etch-deposit-etch-deposit) have been used to etch high aspect ratio features such as through-silicon vias (TSVs). In a time-multiplexed process, a small depth of a feature is etched, then an etching gas is stopped and a passivation gas is started which forms a polymer on the etched sidewalls. This process is repeated until reaching a desired depth. An undesirable side effect of time-multiplexed etching processes, however, is a characteristic scalloping of the sidewalls of a given etched feature as a result of the alternate deposition and etch steps. Profile non-uniformities such as these can lead to fill complications and ultimately degraded electrical performance after subsequent metallization.

An alternative to time-multiplexed etching is a one-step (continuous) process that executes etching and passivation mechanisms simultaneously, typically using fluorine and oxygen-based chemistry. Such one-step processes can create a more continuous profile (no scalloping), but one-step processes experience aspect ratio limitations (particularly at smaller dimensions) and depth limitations.

Techniques disclosed herein include methods for etching deep silicon features using a continuous gas pulsing process that etches high aspect ratio features and leaves a relatively smooth profile. Such methods provide an etch rate faster than the Bosch process, provide an etched profile with no or little undercut, and use a chemistry that provides good mask selectivity. Techniques include using a continuous process that comprises a cyclic gas-pulsing process of alternating chemistries.

One embodiment includes a method for etching deep silicon features on a substrate. This method includes disposing a substrate on a substrate holder in a plasma processing system. The substrate has a patterned mask layer defining openings that expose a silicon surface. A first process gas mixture is flowed into the plasma processing system. This first process gas mixture comprises silicon, oxygen, and at least one halogen. A second process gas mixture is flowed into the plasma processing system. This second process gas mixture comprises a halogen-containing gas and a fluorocarbon gas. Plasma is formed from the first process gas mixture and from the second process gas mixture such that the silicon surface, through the patterned mask layer, is exposed to the plasma. An oxide layer is formed on sidewalls and bottom surfaces of one or more silicon features within the substrate using products from the first gas mixture and the plasma. The method includes etching the one or more silicon features within the substrate using products from the second process gas mixture and the plasma.

In contrast to time-multiplexed processes that use dedicated etch and deposition steps, techniques herein provide gas pulsing that follows an alternating strong-mild etch mechanism (less passivation), but with continuous etching. Such techniques can maintain higher etch rates but without residual polymer residue build-up.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques disclosed herein include methods for etching deep silicon features using a continuous gas pulsing process that etches high aspect ratio features having a relatively smooth profile. Such methods provide an etch rate faster than the Bosch process, provide an etched profile with no or little undercut, and use a chemistry that provides good mask selectivity. Techniques include using a continuous process that comprises a cyclic gas-pulsing process of alternating chemistries.

Techniques herein use two gas chemistries or mixtures and then cycle between each gas chemistry as to which mixture has a dominant flow. Thus, both gas chemistries are flowed simultaneously and continuously, while an amount of each flow varies between a maximum and a minimum.

Figure 1A:
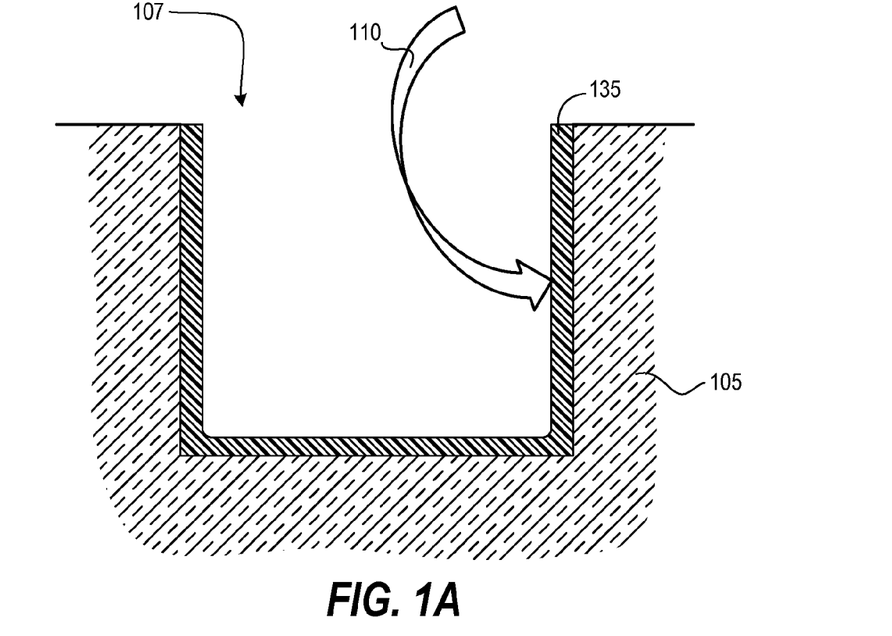
FIGS. 1A-1B are a cross-sectional view of a feature being etched according to embodiments herein.
Figure 1B:
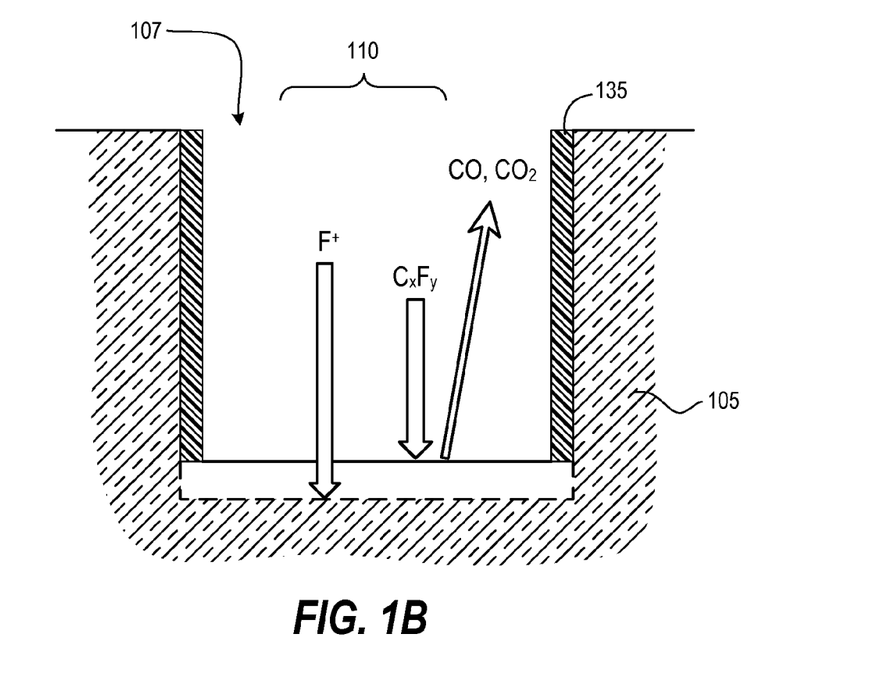

FIGS. 1A and 1B show a feature 107, such as a through-silicon via, being etched into silicon substrate 105. One gas chemistry used in the feature formation is a passivation/oxidizing chemistry 110. The oxidizing chemistry includes silicon, oxygen, and at least one halogen (such as fluorine, chlorine, bromine, etc.). For example, $O_2$ can be used for oxide formation. The silicon and halogen can come from $SiF_4$, $SiCl_4$, $SiBr_4$, etc. $O_2$ can be used alone, but takes substantially more time. The silicon and halogen addition is used to form a halogen-containing oxide deposition 135 that thinly lines sidewalls and bottom surfaces of features being etched.

Another gas chemistry used is etch chemistry 120. The etch chemistry includes a halogen-containing gas and a fluorocarbon gas. For example the halogen-containing gas can include $SF_6$, $NF_3$, $XeF_2$, chloring, bromine, and so forth. The halogen-containing gas primarily functions for etching the silicon substrate 105. The fluorocarbon gas can include $C_xF_y$, where x and y are greater than or equal to one. The fluorocarbon gas is primarily used for etch enhancement by removing oxide 135 from the bottom surfaces of vias. Because the passivation chemistry forms an oxide on feature surfaces, this oxide needs to be removed to continue etching a trench or via.

Figure 2A:
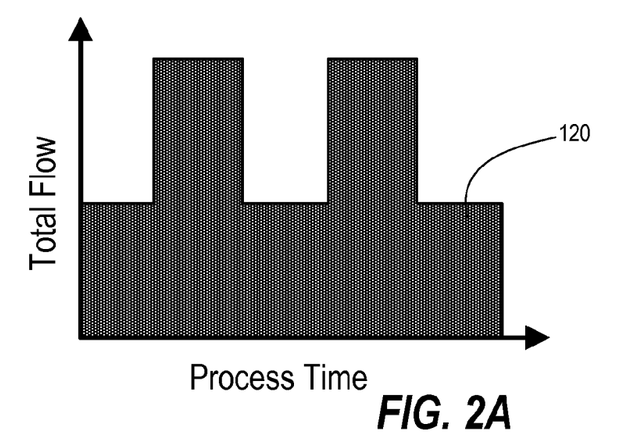
FIGS. 2A-2C are a graph of a continuous gas pulsing process according to embodiments herein.
Figure 2B:
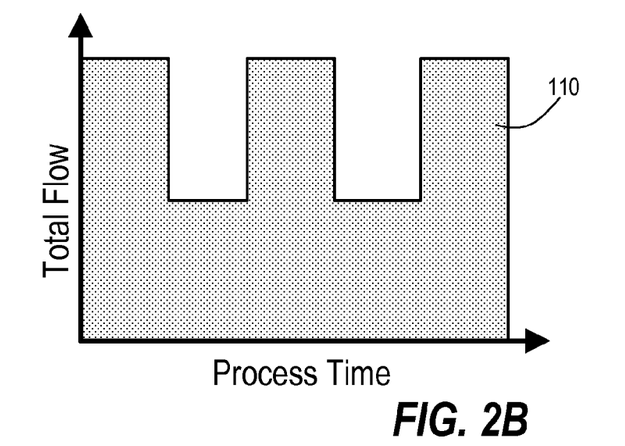
Figure 2C:
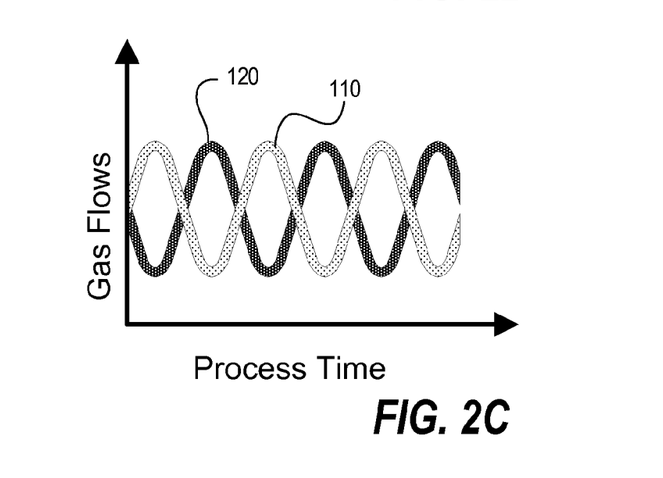

FIGS. 2A-2B are graphs showing a total flow of each gas chemistry relative to process time. FIG. 2A shows a flow of etch chemistry 120 as a function of time. Note that etch chemistry has a continuous amount of minimum flow, and also has a cycle or pattern of increased flow. FIG. 2B shows a flow of oxidizing chemistry 110 as a function of time. As can be seen, oxidizing chemistry 110 also has a minimum amount of continuous flow with repeating periods of increased flow. Comparing FIGS. 2A and 2B shows that the periods of increased or high flow of each gas chemistry alternate with each other. In other words, the etch chemistry and the oxidizing chemistry alternate between having a dominant flow, while each provides a minimum continuous flow. FIG. 2C is a graph that shows both gas chemistry flows. Note that the dominant gas periods can have a gradient or gradual change between dominant flows. Thus, there is etching happening at each step, and the gradient chemical change can help yield smoother sidewalls.

Conventional etch process typically generate polymerizing layers to protect sidewalls. Such polymer passivation is typically provided with a $CF_2$ or similar material that is deposited. With techniques herein, however, an $SiO_2$ or similar material is used to create a conformal oxide, thus providing an oxidizing layer instead of a polymeric/passivating layer. Because an oxide is deposited, with techniques herein, a fluorocarbon, such as $C_4F_8$, is used to remove oxide deposited on bottom/horizontal surfaces to be able to continue to etch into the underlying silicon material.

In some embodiments, an etching regime can be selected that does not produce much $CF_2$. Little or no $CF_2$ is needed in most applications. Thus, $C_4F_8$ can be used as more of a tuning gas. In one example chemistry, $SF_6$ is used for etching, while $SiF_4$ and $O_2$ are used for oxide generation/passivation. Any $CF_x$ ion gases can be added for tuning. The carbon from these gases can be used to remove oxide from the feature bottom. Thus, in the passivation step (oxidizing step), a silicon oxide-like deposition/transformation occurs on the side and bottom of a given etched feature, and then during the step of predominant etching, carbon is added which removes oxide from the bottom surface of the feature, making etching the underlying silicon easier. The passivation step refers to when the passivant gas chemistry (oxidizing chemistry) is predominantly flowed, and then the etching step refers to when etching gas is predominantly flowed relative to the passivant gas chemistry.

Figure 3A:
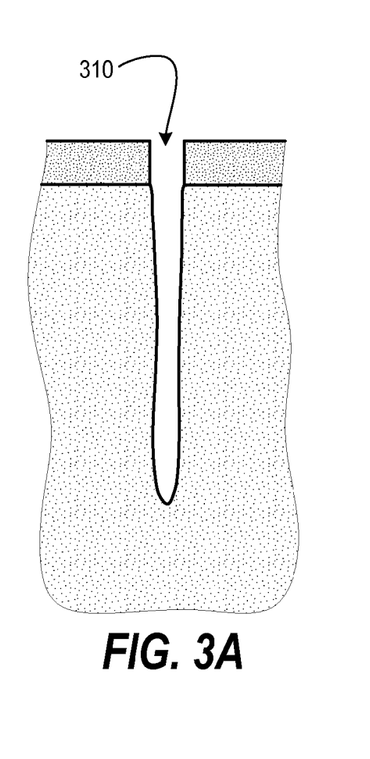
FIGS. 3A-3C are cross-sectional illustrations of results from various etching techniques.
Figure 3B:
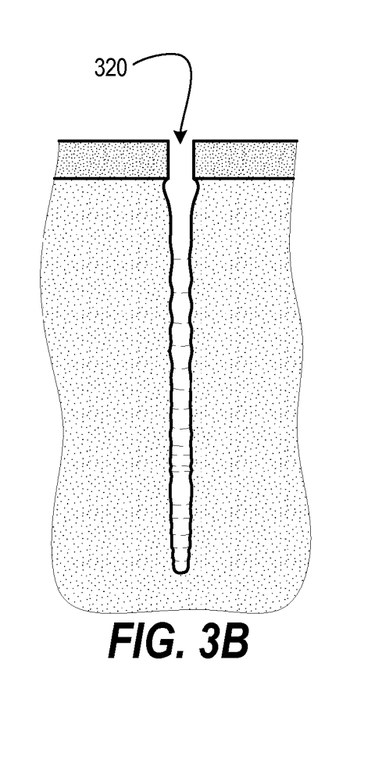
Figure 3C:
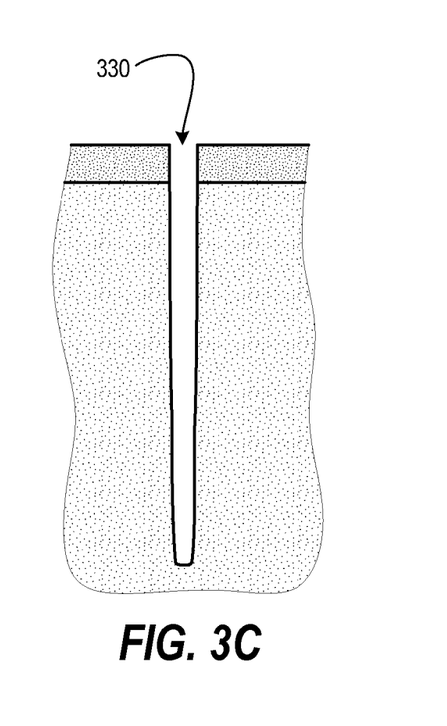

These chemistries disclosed herein, coupled with a gas pulsing technique, provide advantages over conventional techniques. For example FIG. 3A shows a sample etched feature 310 that results from a one-step continuous etch process. Note that the resulting profile can become bowed and then taper to a termination point, which highlights the aspect ratio limitations of a continuous process. FIG. 3B shows a sample etched feature 320 having a typical profile resulting from a time-multiplexed (Bosch) etching process. Although a Bosch process can etch deeper than a one-step process, the profile, unfortunately, develops a rough sidewall surface that appears as a scalloped profile. Moreover, using a conventional fluorocarbon containing passivant can often clog the top of a feature, thus interfering with feature etching. FIG. 3C shows a sample etched feature 330 having a profile that results from executing an etch process according to embodiments herein. The conformal oxide that is formed can reduce scalloping and yield an etched feature with smooth sidewalls and high aspect ratios. Also, since little to no polymer is being deposited, techniques herein avoid clogging a top of a feature. In contrast to depositing a polymer, techniques herein oxidize a surface, and this oxidized surface prevents lateral etching. Note that with time-multiplexed processes, there is truly a deposition on the sidewalls of a given feature, that is, polymer is deposited. The conformal oxide herein, however, can be considered as being grown or saturated.

Figure 4:
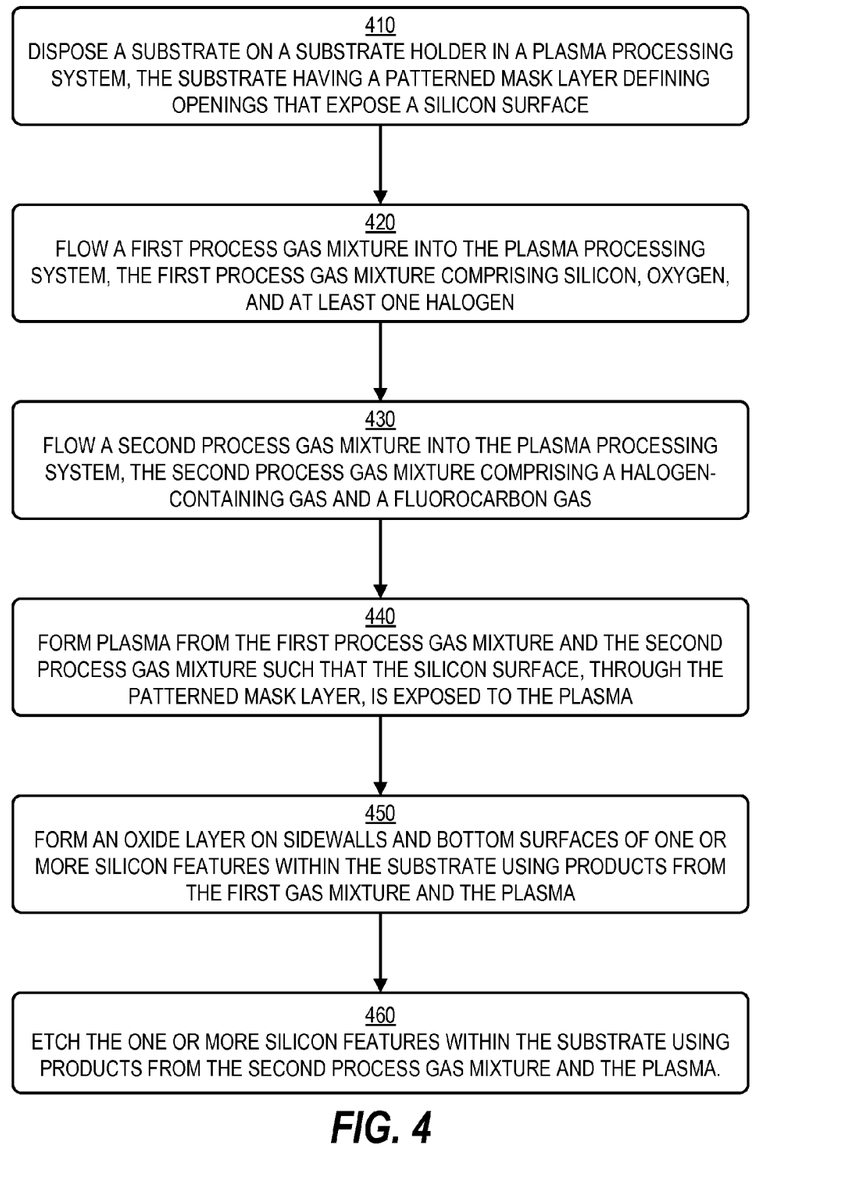
FIG. 4 is a flow chart of method of deep silicon etching according to embodiments herein.

Referring now to FIG. 4, a flow chart shows an example method of executing embodiments herein for etching a deep silicon feature.

In step 410 a substrate is disposed on or placed on a substrate holder in a plasma processing system. The substrate can be, for example, a silicon substrate or wafer. The substrate has a patterned mask layer defining openings that expose a silicon surface. Layering and patterning can be executed using conventional semiconductor fabrication tools. The patterned mask layer can include one or more layers.

In step 420, a first process gas mixture is flowed into the plasma processing system, such as into a space or plasma processing region above the substrate. The first process gas mixture comprises silicon, oxygen, and at least one halogen. For example, the first process gas mixture comprises a halogen-containing silicon gas and an oxygen-containing gas. The halogen-containing silicon gas can be selected from several alternatives including $SiF_x$, $SiCl_x$, and $SiBr_x$, where x is greater than or equal to 1. The oxygen-containing gas can be selected from several options such as atomic oxygen, diatomic oxygen, and ozone. By way of a specific example, the halogen-containing silicon gas can be $SiF_4$, $SiCl_4$, $SiBr_4$, or a halo-silane. Using halogen-containing silicon gas can accelerate growing an oxide layer as compared to using oxide alone. Thus, the first process gas mixture is an $SiO_x$ depositing gas that creates halogen-rich oxide films or oxide-like films.

In step 430, a second process gas mixture is flowed into the plasma processing system. The second process gas mixture comprises a halogen-containing gas and a fluorocarbon gas. For example, the halogen-containing gas from the second process gas mixture can be selected from the group consisting of $SF_6$, $NF_3$, $XeF_2$, chlorine, and bromine. Products from the halogen-containing gas from the second process gas mixture (after ionization) can be used to etch silicon within the substrate. The fluorocarbon gas from the second process gas mixture can be $C_xF_yH_z$, where x and y are greater than or equal to one, and where z is greater than or equal to zero. Products from the fluorocarbon gas and the plasma can be used to etch oxide deposition (from the first process gas mixture) on bottom surfaces of the one or more silicon features. Note that the fluorocarbon gas (which can be $C_4F_8$) is not flowed separately from the etchants, but is instead flowed with the etchants as an oxide etchant instead of as a polymer-forming gas. Thus, the second process gas mixture comprises a halogen-containing etchant and an oxide etchant.

In step 440, plasma is formed from the first process gas mixture and from the second process gas mixture such that the silicon surface, through the patterned mask layer, is exposed to the plasma. Such plasma generation can occur within the plasma processing system in a region above the substrate.

In step 450, an oxide layer is formed on sidewalls and bottom surfaces of one or more silicon features within the substrate using products from the first gas mixture and the plasma. Forming the oxide layer can include conformally depositing or growing an oxide layer on sidewalls and bottom surfaces of one or more silicon features. The oxide deposition includes silicon, oxygen, and at least one halogen.

In step 460, the one or more silicon features within the substrate are etched using products from the second process gas mixture and the plasma.

In some embodiments, respective flow rates of the first process gas mixture and the second process gas mixture can be varied by time such that a dominant flow rate alternates between the first process gas mixture and the second process gas mixture. In other words, both the first process gas mixture and the second process gas mixture have a predetermined minimum flow, and the minimum flow (which can be zero or greater) of one gas occurs while flow of the other gas is at an increased or greater relative flow. Varying the respective flow rates can include having a gradient transition between flow rates, such as what is illustrated in FIG. 2C. Flowing the first process gas mixture and flowing the second process gas mixture can include maintaining respective flow rates above a predetermined amount such that there is a minimum continuous flow of each gas mixture during the step of etching the one or more silicon features. Duty cycle of each gas mixture can be equivalent or different. For example, the etch chemistry time can last longer than the oxidation chemistry time, and this etch-heavy pulsing can have some advantages, such as deeper etching lengths, and thus may be selected for particular etch applications.

Etching the one or more silicon features within the substrate can include continuing an etch process until having formed features characterized by an etch depth of greater than about 20 microns, and having a depth to width aspect ratio greater than about 5 to 1.

Figure 5:
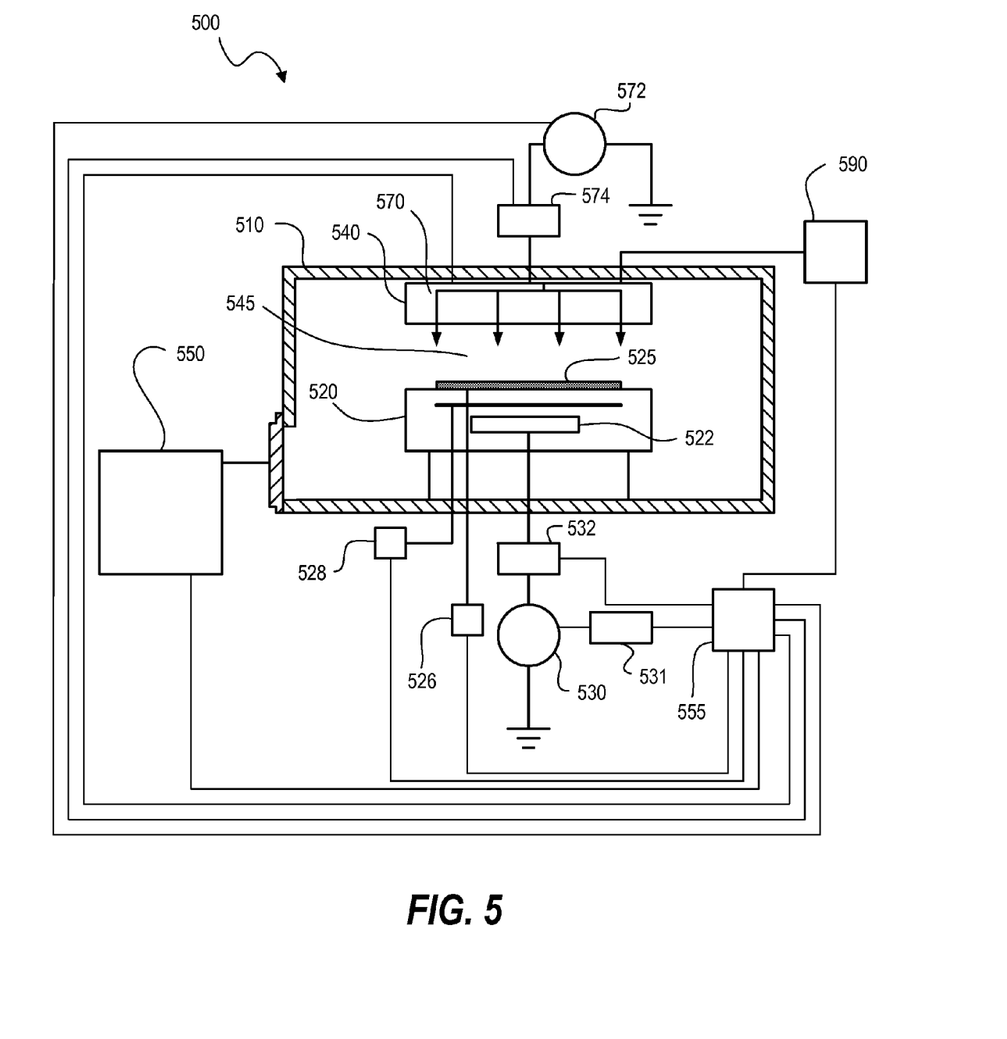
FIG. 5 is a schematic diagram of a plasma processing systems according to embodiments herein.

Various different conventional plasma processing systems can be used for process steps of deposition and etching. One or more of the methods for performing a spacer etch process sequence according to various embodiments described above may be performed in any one of various conventional plasma processing systems. FIG. 5 illustrates one example plasma processing system 500. Plasma processing system 500 is configured to perform the above identified process condition, and includes a plasma processing chamber 510, substrate holder 520, upon which a substrate 525 to be processed is affixed, and vacuum pumping system 550. Substrate 525 can be a semiconductor substrate, a wafer, a flat panel display, or a liquid crystal display. Plasma processing chamber 510 can be configured to facilitate the generation of plasma in plasma processing region 545 in the vicinity of a surface of substrate 525. An ionizable gas or mixture of process gases is introduced via a gas distribution system 540. For a given flow of process gas, the process pressure is adjusted using the vacuum pumping system 550. Plasma can be utilized to create materials specific to a pre-determined materials process, and/or to aid the removal of material from the exposed surfaces of substrate 525. The plasma processing system 500 can be configured to process substrates of any desired size, such as 200 mm substrates, 300 mm substrates, 450 mm or larger.

Substrate 525 can be affixed to the substrate holder 520 via a clamping system 528, such as a mechanical clamping system or an electrical clamping system (e.g., an electrostatic clamping system). Furthermore, substrate holder 520 can include a heating system (not shown) or a cooling system (not shown) that is configured to adjust and/or control the temperature of substrate holder 520 and substrate 525. The heating system or cooling system may comprise a re-circulating flow of heat transfer fluid that receives heat from substrate holder 520 and transfers heat to a heat exchanger system (not shown) when cooling, or transfers heat from the heat exchanger system to substrate holder 520 when heating. In other embodiments, heating/cooling elements, such as resistive heating elements, or thermo-electric heaters/coolers can be included in the substrate holder 520, as well as the chamber wall of the plasma processing chamber 510 and any other component within the plasma processing system 500.

Additionally, a heat transfer gas can be delivered to the backside of substrate 525 via a backside gas supply system 526 in order to improve the gas-gap thermal conductance between substrate 525 and substrate holder 520. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 525.

Substrate holder 520 can comprise an electrode 522 through which RF power is coupled to the processing plasma in plasma processing region 545. For example, substrate holder 520 can be electrically biased at a RF voltage via the transmission of RF power from a RF generator 530 through an optional impedance match network 532 to substrate holder 520. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are known to those skilled in the art.

Furthermore, the electrical bias of electrode 522 at a RF voltage may be pulsed using pulsed bias signal controller 531. The RF power output from the RF generator 530 may be pulsed between an off-state and an on-state, for example. Alternately, RF power is applied to the substrate holder electrode at multiple frequencies. Furthermore, impedance match network 532 can improve the transfer of RF power to plasma in plasma processing chamber 510 by reducing the reflected power. Match network topologies (e.g. L-type, π-type, T-type, etc.) and automatic control methods are known to those skilled in the art.

Gas distribution system 540 may comprise a showerhead design for introducing a mixture of process gases. Alternatively, gas distribution system 540 may comprise a multi-zone showerhead design for introducing a mixture of process gases and adjusting the distribution of the mixture of process gases above substrate 525. For example, the multi-zone showerhead design may be configured to adjust the process gas flow or composition to a substantially peripheral region above substrate 525 relative to the amount of process gas flow or composition to a substantially central region above substrate 525.

Vacuum pumping system 550 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 510.

Controller 555 comprises a microprocessor, memory, and a digital I/O port capable of generating control voltages sufficient to communicate and activate inputs to plasma processing system 500 as well as monitor outputs from plasma processing system 500. Moreover, controller 555 can be coupled to and can exchange information with RF generator 530, pulsed bias signal controller 531, impedance match network 532, the gas distribution system 540, vacuum pumping system 550, as well as the substrate heating/cooling system (not shown), the backside gas supply system 526, and/or the electrostatic clamping system 528. For example, a program stored in the memory can be utilized to activate the inputs to the aforementioned components of plasma processing system 500 according to a process recipe in order to perform a plasma assisted process, such as a plasma etch process, on substrate 525.

Controller 555 can be locally located relative to the plasma processing system 500, or it can be remotely located relative to the plasma processing system 500. For example, controller 555 can exchange data with plasma processing system 500 using a direct connection, an intranet, and/or the internet. Controller 555 can be coupled to an intranet at, for example, a customer site (i.e., a device maker, etc.), or it can be coupled to an intranet at, for example, a vendor site (i.e., an equipment manufacturer). Alternatively or additionally, controller 555 can be coupled to the internet. Furthermore, another computer (i.e., controller, server, etc.) can access controller 555 to exchange data via a direct connection, an intranet, and/or the internet.

Plasma processing system 500 can further comprise either a stationary, mechanically, or electrically rotating magnetic field system (not shown) to potentially increase plasma density and/or improve plasma processing uniformity. Moreover, controller 555 can be coupled to a magnetic field system to regulate the speed of rotation and field strength. The design and implementation of a rotating magnetic field is well known to those skilled in the art.

Plasma processing system 500 can further comprise an upper electrode 570 to which RF power can be coupled from RF generator 572 through optional impedance match network 574. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 555 is coupled to RF generator 572 and impedance match network 574 in order to control the application of RF power to upper electrode 570. The design and implementation of an upper electrode is known to those skilled in the art. The upper electrode 570 and the gas distribution system 540 can be designed within the same chamber assembly, as shown. Alternatively, upper electrode 570 may comprise a multi-zone electrode design for adjusting the RF power distribution coupled to plasma above substrate 525. For example, the upper electrode 570 may be segmented into a center electrode and an edge electrode.

Plasma processing system 500 can further comprise a direct current (DC) power supply 550 coupled to the upper electrode 570 opposing substrate 525. The upper electrode 570 may comprise an electrode plate. The electrode plate may comprise a silicon-containing electrode plate. Moreover, the electrode plate may comprise a doped silicon electrode plate. The DC power supply 550 can include a variable DC power supply. Additionally, the DC power supply 550 can include a bipolar DC power supply. The DC power supply 550 can further include a system configured to perform at least one of monitoring, adjusting, or controlling the polarity, current, voltage, or on/off state of the DC power supply 550. Once plasma is formed, the DC power supply 550 facilitates the formation of a ballistic electron beam. An electrical filter (not shown) may be utilized to de-couple RF power from the DC power supply 550.

For example, the DC voltage applied to upper electrode 570 by DC power supply 550 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 570. The surface of the upper electrode 570 facing the substrate holder 520 may be comprised of a silicon-containing material.

Other types of known plasma processing systems can also be used to execute techniques disclosed herein. For example, alternate plasma processing systems (not shown) further comprise an inductive coil to which RF power is coupled via an RF generator through an optional impedance match network. RF power is inductively coupled from the inductive coil through a dielectric window to the plasma processing region. A frequency for the application of RF power to the inductive coil can range from about 10 MHz to about 100 MHz. Similarly, a frequency for the application of power to the chuck electrode can range from about 0.1 MHz to about 100 MHz. In addition, a slotted Faraday shield can be employed to reduce capacitive coupling between the inductive coil and plasma in the plasma processing region. Moreover, a controller can be coupled to the RF generator and the impedance match network to control the application of power to the inductive coil.

In an alternate embodiment, a plasma processing system can comprise an inductive coil that is a "spiral" coil or "pancake" coil in communication with the plasma processing region from above as in a transformer-coupled plasma (TCP) reactor. The design and implementation of an inductively coupled plasma (ICP) source, or transformer coupled plasma (TCP) source, is well known to those skilled in the art. Alternately, plasma can be formed using electron cyclotron resonance (ECR). In yet another embodiment, the plasma is formed from the launching of a Helicon wave. In yet another embodiment, the plasma is formed from a propagating surface wave. Other plasma processing systems can be similar to the embodiment of FIG. 5, and can further comprise a surface wave plasma (SWP) source. The SWP source can comprise a slot antenna, such as a radial line slot antenna (RLSA), to which microwave power is coupled via a power coupling system. Each plasma source described above is well known to those skilled in the art.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to the object being processed in accordance with the invention. The substrate may include any material portion or structure of a device, particularly a semiconductor or other electronics device, and may, for example, be a base substrate structure, such as a semiconductor wafer, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for etching deep silicon features on a substrate, comprising:
   disposing a substrate on a substrate holder in a plasma processing system, the substrate having a patterned mask layer defining openings that expose a silicon surface;
   flowing a first process gas mixture into the plasma processing system, the first process gas mixture comprising silicon, oxygen, and at least one halogen;
   flowing a second process gas mixture into the plasma processing system, the second process gas mixture comprising a halogen-containing gas and a fluorocarbon gas;
   forming plasma from the first process gas mixture and the second process gas mixture such that the silicon surface, through the patterned mask layer, is exposed to the plasma;
   forming an oxide layer on sidewalls and bottom surfaces of one or more silicon features within the substrate using products from the first gas mixture and the plasma; and
   etching the one or more silicon features within the substrate using products from the second process gas mixture and the plasma.

2. The method of claim 1, further comprising:
   varying respective flow rates by time of the first process gas mixture and the second process gas mixture such that a dominant flow rate alternates between the first process gas mixture and the second process gas mixture.

3. The method of claim 2, wherein varying the respective flow rates includes a gradient transition between flow rates.

4. The method of claim 2, wherein flowing the first process gas mixture and flowing the second process gas mixture includes maintaining respective flow rates above a predetermined amount such that there is a minimum continuous flow of each gas mixture during the step of etching the one or more silicon features.

5. The method of claim 1, wherein the first process gas mixture comprises a halogen-containing silicon gas and an oxygen-containing gas.

6. The method of claim 5, wherein the halogen-containing silicon gas is selected from the group consisting of $SiF_x$, $SiCl_x$, and $SiBr_x$, where x is greater than or equal to 1.

7. The method of claim 5, wherein the oxygen-containing gas is selected from the group consisting of atomic oxygen, diatomic oxygen, and ozone.

8. The method of claim 1, wherein forming the oxide layer includes conformally depositing an oxide deposition on sidewalls and bottom surfaces of one or more silicon features.

9. The method of claim 8, wherein the oxide deposition includes silicon, oxygen, and at least one halogen.

10. The method of claim 1, wherein the halogen-containing gas from the second process gas mixture is selected from the group consisting of $SF_6$, $NF_3$, $XeF_2$, chlorine, and bromine.

11. The method of claim 10, wherein products from the halogen-containing gas from the second process gas mixture are used to etch silicon within the substrate.

12. The method of claim 1, wherein the fluorocarbon gas from the second process gas mixture is $C_xF_yH_z$, where x and y are greater than or equal to one, and where z is greater than or equal to zero.

13. The method of claim 12, wherein products from the fluorocarbon gas and the plasma are used to etch oxide deposition on bottom surfaces of the one or more silicon features.

14. The method of claim 1, wherein etching the one or more silicon features within the substrate includes etching until forming features characterized by an etch depth of greater than about 20 microns, and having a depth to width aspect ratio greater than about 5 to 1.

* * * * *